United States Patent
Lu et al.

(10) Patent No.: US 7,926,020 B1
(45) Date of Patent: Apr. 12, 2011

(54) METHODS FOR AUTOMATICALLY GENERATING ASSERTIONS

(76) Inventors: Yuan Lu, San Jose, CA (US); Yunshan Zhu, Cupertino, CA (US)

( * ) Notice: Subject to any disclaimer, the term of this patent is extended or adjusted under 35 U.S.C. 154(b) by 49 days.

(21) Appl. No.: 11/672,919

(22) Filed: Feb. 8, 2007

Related U.S. Application Data

(60) Provisional application No. 60/766,746, filed on Feb. 9, 2006.

(51) Int. Cl.
*G06F 17/50* (2006.01)
(52) U.S. Cl. .......................................... 716/136
(58) Field of Classification Search .................. 716/4
See application file for complete search history.

(56) References Cited

U.S. PATENT DOCUMENTS

| | | | |
|---|---|---|---|
| 2003/0115562 A1* | 6/2003 | Martin et al. | 716/5 |
| 2005/0198597 A1* | 9/2005 | Zhu et al. | 716/4 |
| 2005/0229044 A1* | 10/2005 | Ball | 714/38 |
| 2007/0074152 A1* | 3/2007 | Roe | 717/104 |

* cited by examiner

*Primary Examiner* — Vuthe Siek
*Assistant Examiner* — Aric Lin
(74) *Attorney, Agent, or Firm* — Carr & Ferrell LLP

(57) ABSTRACT

One embodiment of the present invention provides a method that automatically generates assertions of a hardware design. The method includes accessing a trace and a set of predicates of the hardware design. Then, the trace is projected over the set of predicates to generate a second trace. Then, a new set of states of the second trace is computed and the result is represented as a logical formula. The formula is reduced by logic optimization techniques. And finally, a set of logical consequences of the logic formula is produced and each logical consequence is enumerated as an assertion.

30 Claims, 5 Drawing Sheets

METHODS FOR AUTOMATICALLY GENERATING ASSERTIONS

CROSS REFERENCE TO RELATED APPLICATIONS

This application claims the benefit of provisional patent application Ser. No. 60/766,746, filed Feb. 9, 2006, which is incorporated herein by reference.

BACKGROUND OF THE INVENTION

1. Field of the Invention

This invention relates to the design and verification of hardware systems, such as digital integrated circuits. More specifically, this invention relates to a method for generating a set of assertions of a hardware design that are true for a trace, where the trace is based on a sequence of design inputs.

2. Description of the Related Art

An electronic design automation (EDA) system is a form of computer aided design (CAD) system used for designing hardware systems such as integrated circuit (IC) devices. FIG. 1 illustrates a process for electronic design automation. The EDA system typically receives one or more high level behavioral descriptions of hardware design (see step 101) (e.g. in hardware description languages like VHDL, Verilog, etc.) and translates this high level design language description into netlists of various levels of abstraction, including nodes and edges (see step 102). At a higher level of abstraction, a generic netlist is typically produced based on library primitives. The generic netlist can be translated into a lower level technology-specific netlist based on a technology-specific library. A netlist describes the IC design and is composed of nodes (also referred to as design elements) and edges, e.g., connections between nodes, and can be represented using a directed cyclic graph structure having nodes which are connected to each other. The netlist is typically stored in computer readable media (also referred to as a computer readable storage medium) within the EDA system and optimized, verified and otherwise processed using many well known techniques (see step 103). The netlist may then be used to generate a physical device layout in mask form at step 104. The layout can be used to directly implement structures in silicon to realize the physical IC device at step 105.

At several points in the design process, it is useful to be able to simulate and verify the design, or parts of the design, to verify that it operates logically as desired. If errors are found, then the design is modified or corrected in iterative fashion as necessary. Several methods are known for verifying circuit designs. In one method, software models of the design are created and the software models are tested against designer-specified test cases. In other methods, each component in the design is modeled as a state transition system and described using logical formulas. All possible behaviors of the circuit design are then exercised to confirm that the design performs in accordance with the state transition logical formulas. The latter methods are more exhaustive than the former, but can require large amounts of time and computing power to generate and execute.

A design verification methodology, known as assertion-based verification, involves testing a simulation of the circuit against one or more assertions describing how the circuit should behave. An "assertion" is a statement that captures the intended behavior of a hardware design. For example, a request must always be followed by a grant within two clock cycles. Assertions allow for automated checking that the specified property is true, and can generate automatic error messages if the property is not true. Industry organizations have defined standardized assertion languages that designers can use to specify their assertions, and for which tool vendors have developed automated checking tools.

An assertion typically relates the values of one or more design elements in a hardware design at one or more time instances. Assertions can be viewed as declarative specifications of the underlying hardware design. An assertion failure indicates an error or a bug of the hardware design. Assertions have been widely used in both hardware designs and software designs to aid design, verification and debugging.

In main stream design and verification methodologies, engineers write assertions manually. A large design often contains thousands of assertions. Manual creation of assertions is time consuming and error prone.

Existing approaches for automatically generating of assertion can be divided into two categories. Approaches in the first category are similar to software linting tools. Syntactical analysis is the key to such approaches. Assertions are generated based on pre-defined patterns in the syntax of HDL descriptions, such as one-hot encoding; or based on comments that users have written, such as full case and parallel case pragmas; or based on particular constructs of a hardware design, such as latch inference or clock-domain crossing. These lint-like approaches have a number of drawbacks. The analysis is based on syntactical structure of HDL descriptions, and it does not "understand" the actual functionality or the semantics of a design. As a consequence, assertions generated in this approach often fail to capture the real functional behaviors of the design and miss bugs. These approaches also produce many false warning messages.

Approaches in the second category are based on trial-and-error. More specifically, in these approaches, a set of candidate assertions are enumerated and tested against simulation traces, and the assertions that passed the simulation traces are presented as design assertions. The problem with such brute-force approaches is inefficiency—the space of candidate assertions is simply too vast to test through long simulation traces. In practice, these approaches generate candidate assertions based on some limited and pre-defined patterns, such as mutual exclusion or request and acknowledgment pairs. As a consequence, these approaches fail to generate useful assertions that do not fit the pre-defined patterns. Even for the pre-defined patterns, these approaches are often too slow for practical designs.

Hence, a method and an apparatus for automatically and efficiently generating assertions is needed that can capture general behaviors, including temporal behaviors, of design elements in a hardware design.

SUMMARY OF THE CLAIMED INVENTION

This invention relates to the design and verification of hardware systems, such as digital hardware circuits. One embodiment of the present invention provides a method that automatically generates assertions of a hardware design. The process accesses trace data and a set of predicates of the hardware design. Then, the process projects the trace over the set of predicates to generate a second trace. Then, the process computes a set of states of the second trace and represents the result as a logical formula. And finally, the process produces a set of logical consequences of the logical formula and enumerates each logical consequence as an assertion.

DETAILED DESCRIPTION

In the following detailed description, preferred embodiments are described to illustrate the present invention, not to limit its scope, which is defined by the claims. Those of ordinary skill in the art will recognize a variety of equivalent variations on the description that follows.

A hardware design is typically described in hardware description languages (HDLs). Such languages include, but are not limited to, Verilog, SystemVerilog, VHDL, SystemC, etc.

Suppose V is a finite set of variables $\{v_0, \ldots, v_n\}$. Each variable represents a node in a netlist, where the netlist is a behavioral description of a hardware design. A trace over V is a sequence $\pi = \alpha_0 \alpha_1 \ldots$, where each $\alpha_i$ is called a state. A state is a complete assignment of variables in V at time i. An assignment is a pair $(v_i, c_i)$, where $v_i$ is a variable and $c_i$ is its corresponding value. A complete assignment of V contains one assignment for every variable in V.

Figure 1:
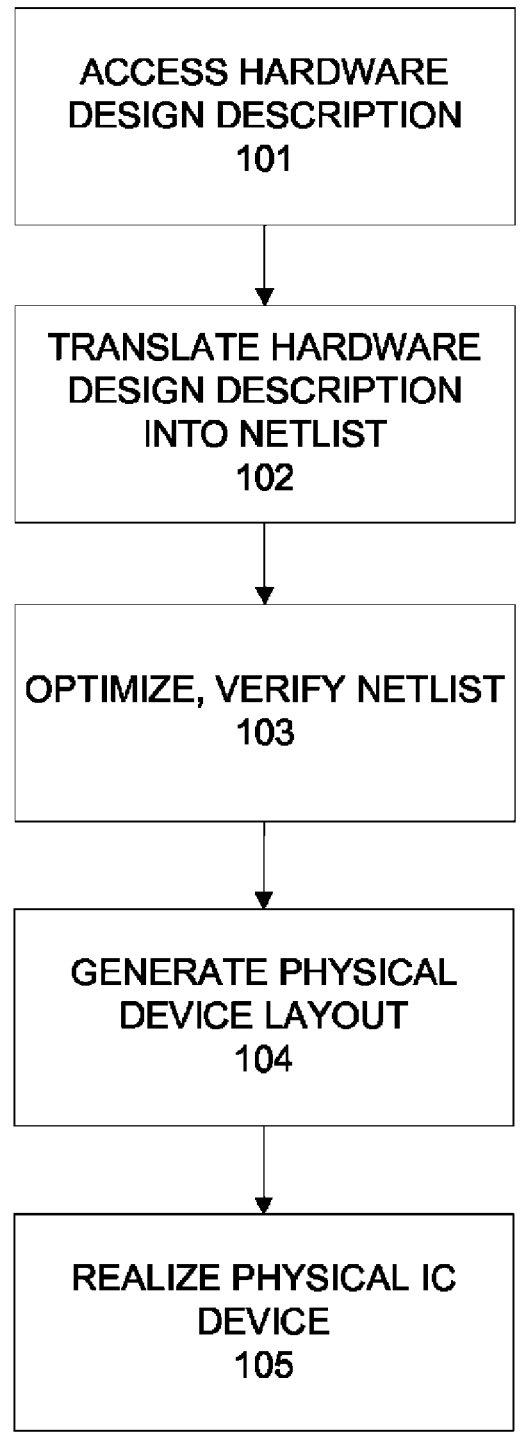
FIG. 1 illustrates an exemplary process for electronic design automation.
Figure 2:
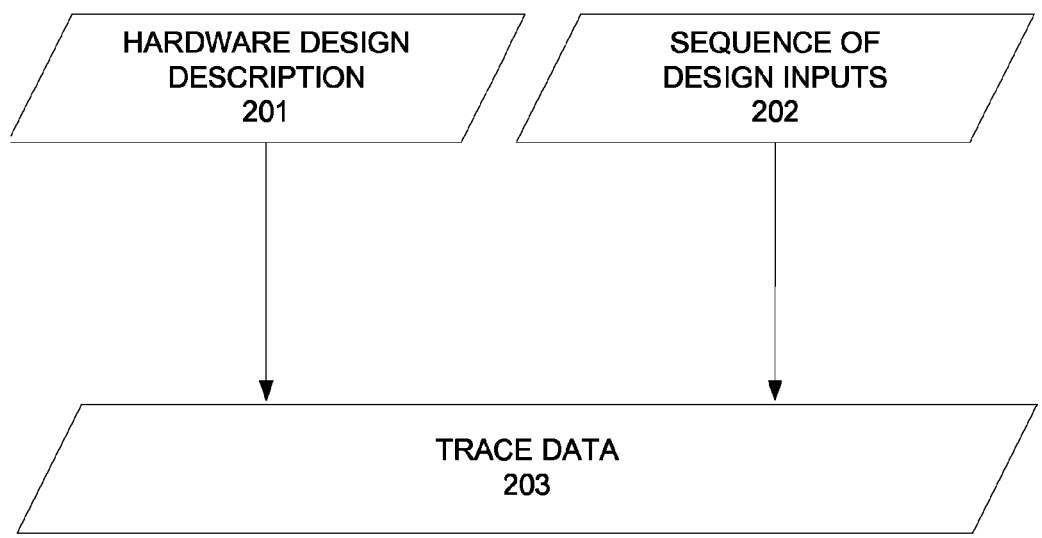
FIG. 2 illustrates a process for obtaining a trace from a hardware design.

FIG. 2 illustrates a logical flow for obtaining a trace from a hardware design. Given a hardware design 201, a set of variables S can be collected from the design. A trace 203 over S is obtained by computing the netlist node values in a design based on a sequence of design inputs 202. There are multiple ways in which the netlist node values can be computed. They include, but are not limited to, manual construction, event-based simulation, cycle-based simulation, FPGA emulation, hardware acceleration, and probing of actual hardware implementation. Techniques in the present invention are applicable to one or multiple traces. For the simplicity of the discussion, the description is based on a single trace. It is straightforward to extend the description to handle multiple traces by first merging them into a single trace.

An assertion is a formal statement describing the behavior of a hardware design. It relates values of design elements in a hardware design over one or more time instances. An assertion can be written in hardware description languages as well as in assertion languages. Recently, several assertion languages such as SystemVerilog Assertion (SVA) and Property Specification Language (PSL) have been standardized.

An assertion evaluates to either true or false for a state in a trace. An assertion is true for a trace if it is true for every state in the trace.

In the following descriptions, an assertion is defined as a well-formed formula consisting of atomic formulas (or atoms) connected by Boolean operators, such as and, or, nand, xor, negation, etc. An atomic formula is a predicate over a set of variables. A Boolean predicate represents a relation among variables and the relation is Boolean, i.e., the value of the predicate is either true or false. A basic predicate is a 1-bit Boolean variable (which represents a design element in a netlist), for example a variable called inc which is either true or false. An atomic formula may contain temporal operators. Common temporal operators include X (next), P (previous), G (global), F (future), etc. For example, X cnt>cnt and inc are two atomic formulas, and inc→Xcnt>cnt is an assertion.

In Boolean logic, an atomic formula must be of Boolean type. Consequently, given a trace, an atomic formula must have a truth value for each state in the trace. In some HDL description, multi-value logics are used. For example, in Verilog, each scalar variable can have four values: 0, 1, x, and z. The following description focuses on Boolean logic, but the extension to handle multi-value logics is straightforward. For example, dual-rail encoding can be used to reduce four-value logic into Boolean logic by encoding x as 11 and z as 10.

Figure 3:
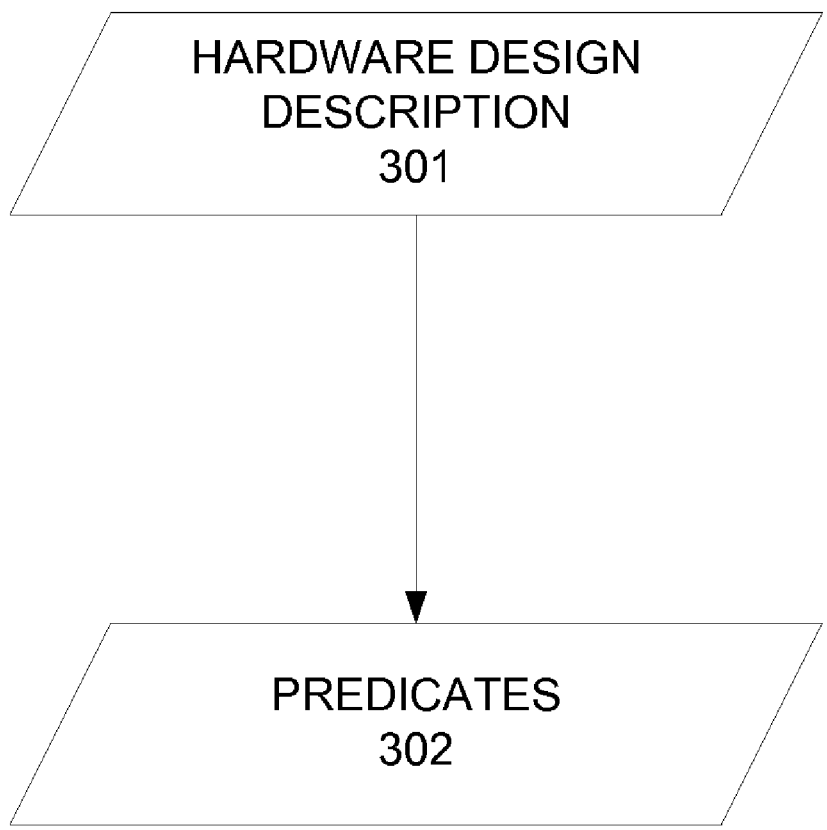
FIG. 3 illustrates a logical flow for obtaining predicates from a hardware design.

Given an HDL description 301 in FIG. 3, a number of approaches exist to generate atomic formulas, i.e. predicates 302 in FIG. 3. The approaches include, but are not limited to, manual input, syntactical analysis, semantical analysis, type analysis, heuristics and pattern matching.

Given a trace s over a set of variables V and a set of atomic formulas A over a subset of V, the trace s can be projected to A by evaluating the truth values of each atomic formula in A for each state in the trace. By definition, each atomic formula must have a truth value for each state in the trace. The evaluation of an atomic formula involves multiple states if the atomic formula contains temporal operators. The evaluation of an atom formula is based on the defined semantics of operators (include temporal and non-temporal operators). If an atomic formula contains temporal operators, next state and previous state in a trace must be well-defined. In one variation of this embodiment, states are sampled at the clock boundaries of the traces, and the next state represents netlist node values at the next clock cycle, the previous state represents netlist node values at the previous clock cycle.

Suppose that atomic formulas in a set A are named using Boolean variables $f_1, f_2, \ldots, f_n$. Suppose that the projection of trace s to atomic formula set A is named trace t. Each state in a trace t contains a complete assignment of atomic formulas represented by $f_1, f_2, \ldots, f_n$. The Boolean variables $f_1, f_2, \ldots, f_n$ can be treated as aliases for their corresponding atomic formulas. In the following descriptions, these Boolean variables will be used in place of atomic formulas. Using substitution, assertions over these Boolean variables can be easily transformed back to assertions over original design elements. By construction, if an assertion is true in trace t, its corresponding assertion by substituting $f_i$ with the original atomic formula must be true in the original trace s.

For a trace over a set of Boolean variables, its state can be represented as a minterm over the set of Boolean variables. A minterm over a set of Boolean variables is a conjunction in which each Boolean variable or its negation must appear. For example, a state in trace t where all atomic formulas are false is represented as a minterm $\neg f_1 \wedge \neg f_2 \wedge \ldots \neg f_n$, where $\neg$ denotes negation and $\wedge$ denotes conjunction.

For a trace over a set of Boolean variables, a set of states in the trace can be represented as a disjunction of minterms. For example, if a trace that contains two states, where one state contains all true atoms and the other state contains all false atoms, its set of states is represented as $(\neg f_1 \wedge \neg f_2 \wedge \ldots \neg f_n) \vee (f_1 \wedge f_2 \wedge \ldots f_n)$, where $\neg$ denotes negation, $\wedge$ denotes conjunction, and $\vee$ denotes disjunction. This representation is referred to as disjunctive normal form or DNF. More specifically, a DNF is a disjunction of one or more cubes, where each cube is a conjunction of literals, where a literal is a Boolean variable or its negation.

The DNF formula of a trace can be computed by taking a disjunction of all minterms representing states in the trace. The size of the DNF formula can be reduced by using existing logic optimization techniques, including both BDD-based and non-BDD-based techniques.

Suppose that the set of all states in a trace t is represented as a DNF $d(f_1, \ldots, f_n)$. An assertion $a(f_1, \ldots, f_n)$ is true in trace t if and only if $d(f_1, \ldots, f_n) \vdash a(f_1, \ldots, f_n)$, where ⊢ denotes logical implication. By computing the set of assertions that are implied by the DNF, assertions that are true for the original trace s can be generated.

Any Boolean formula can be converted into a logically equivalent formula that is in conjunctive normal form or CNF. A CNF formula is a conjunction of one or more clauses, where each clause is a disjunction of one or more literals, where a literal is a Boolean variable or its negation. The size of a clause is defined as the number of literals that it contains.

Figure 4:
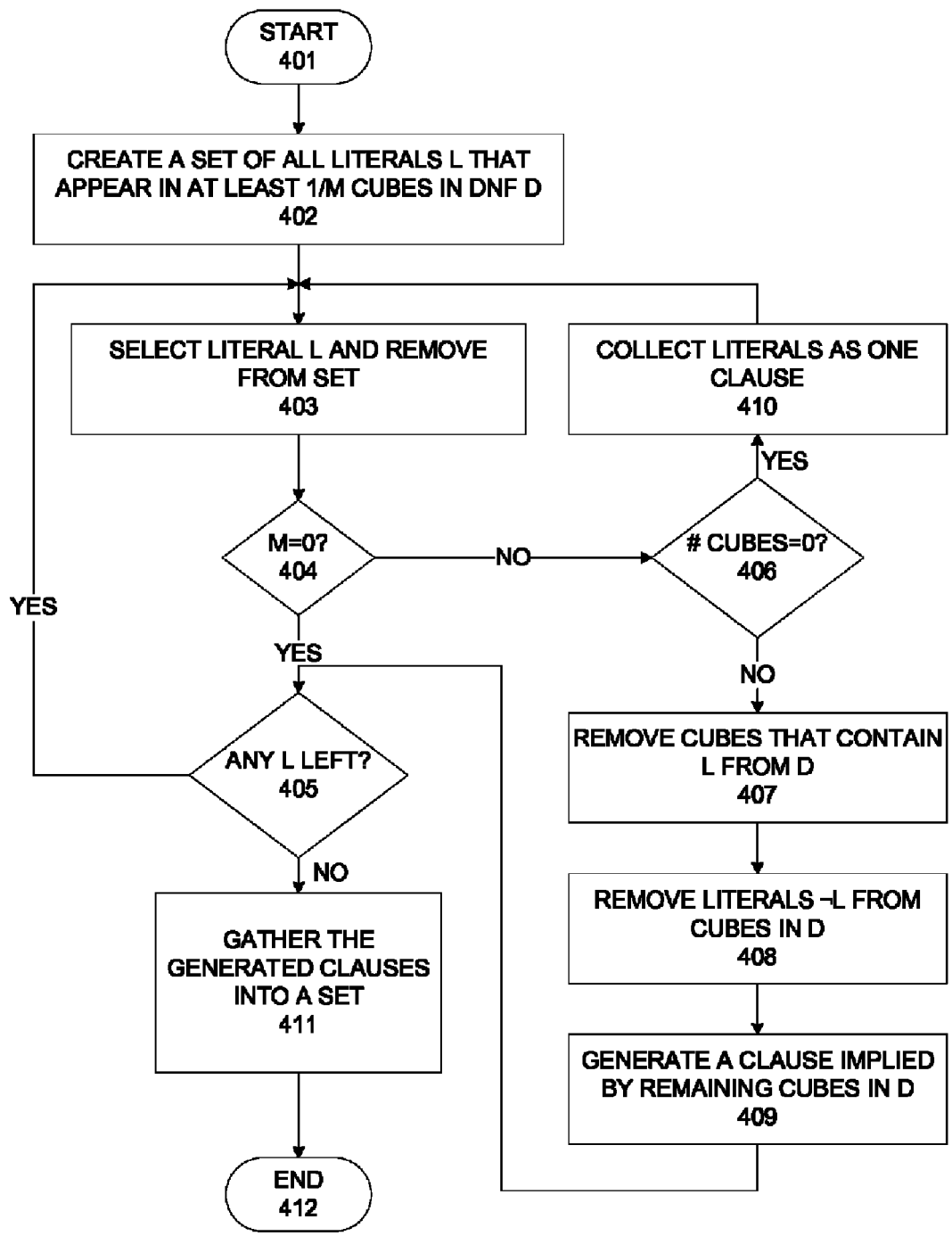
FIG. 4 illustrates a flow chart illustrating an exemplary process for generating specified clauses that are implied by a DNF formula.

FIG. 4 illustrates a flow chart illustrating an exemplary process for generating specified clauses that are implied by a DNF formula. In one embodiment of the present invention, the following procedure is used to generate all clauses of size less than or equal to M that are implied by a DNF formula d. By repeatedly performing this procedure for incrementing values of M, all clauses that are implied by DNF d are generated. First, a set of all literals L that appears in at least 1/M cubes in d are created at step 402. A literal L is selected and removed from the set at step 403. If M equals 0 or no such literal exists at step 404, backtrack. If the total number of cubes equals 0 at step 406, collect all picked literals so far as one clause at step 410 and backtrack. Otherwise, continue to remove all cubes that contain L from DNF d at step 407. Next, remove all literals ¬L, from all cubes in d at step 408. Next, execute the procedure recursively at step 409 to generate a clause of size less than or equal to M−1 that is implied by the remaining cubes. When a backtrack occurs, the procedure returns to the previous call stack, selects a new literal L, and repeats the steps 402, 407, and 409. If the call stack is empty after a back track, i.e. at the top level of procedure, the procedure exits and returns the set of all collect clauses as result.

In one variant on this embodiment, assertions are generated by enumerating all clauses over the atom formulas, evaluating each clause over the trace, and reporting the ones that are true in the trace.

In another variant on this embodiment, assertions are generated by enumerating all clauses over the atom formulas and reporting the ones that are implied by $d(f_1, \ldots, f_n)$. The logic implication relation can be determined by a number of techniques including propositional decision procedure (SAT solver), BDDs, ATPG, and other decision procedures.

Figure 5:
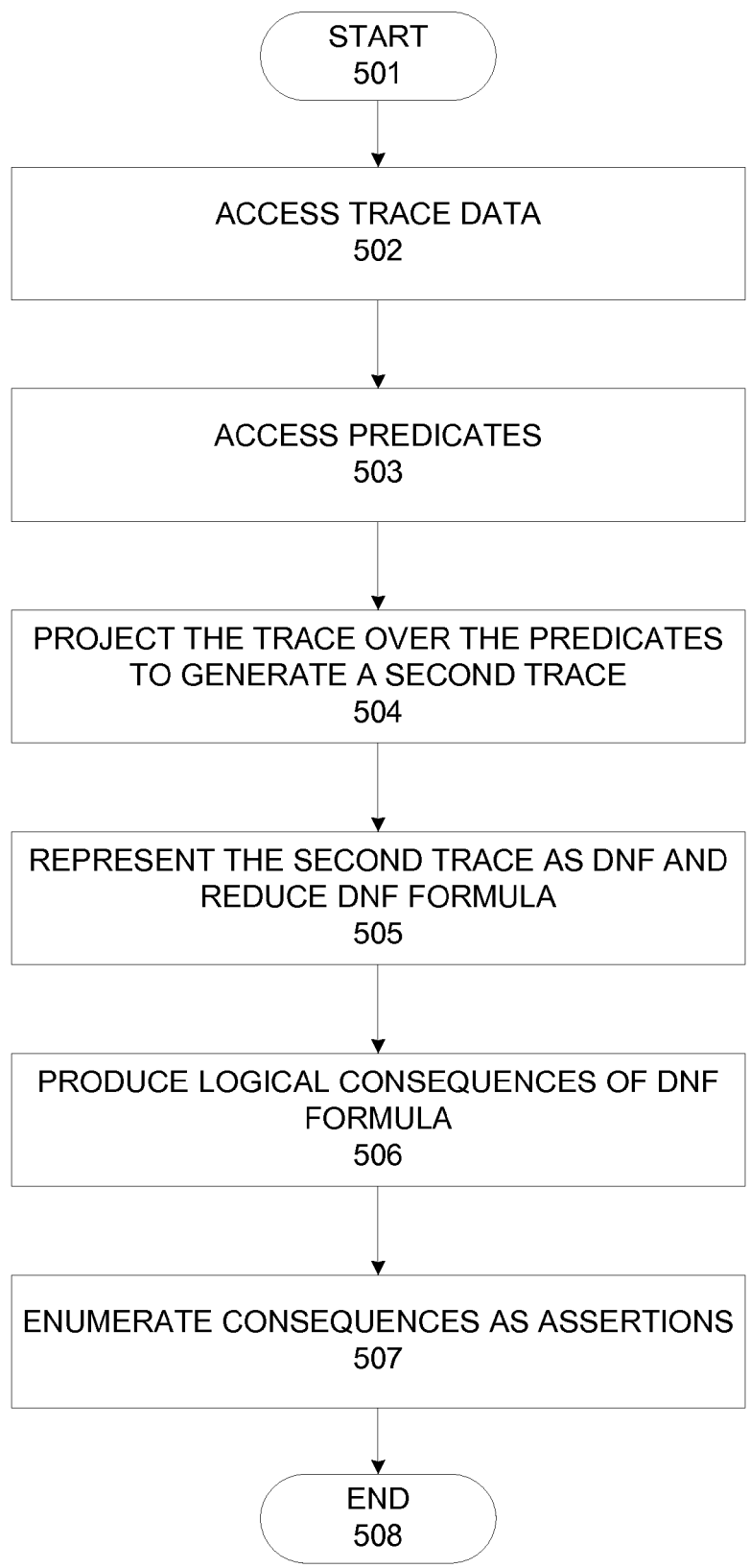
FIG. 5 illustrates a flow chart illustrating an exemplary process for generating assertions.

FIG. 5 illustrates a flow chart illustrating an exemplary process of generating assertions in accordance with an embodiment of the present invention. FIG. 5 begins in step 501. In step 502, trace data obtained from a hardware design is accessed. In step 503, predicates from the hardware design are accessed. Next, in step 504, the trace data is projected over the predicates to generate a second trace. Next, in step 505, the second trace is represented as a DNF formula and reduced by logic optimization techniques. Next, in step 506, the logical consequences implied by the reduced DNF formula are produced. Next, in step 507 each consequence is enumerated as an assertion. FIG. 5 ends in step 508.

What is claimed is:

1. A method for generating assertions of a hardware design to aid verification in an electronic design automation (EDA) system, the method comprising:
    accessing trace data of a hardware design, wherein the trace data is a sequence of recorded netlist node values of the hardware design, obtained while the hardware design executed one or more tests;
    accessing a predetermined set of predicates of the hardware design by a computer, wherein each predicate represents a Boolean relation among netlist nodes in the hardware design;
    projecting the trace data over the set of predicates by a computer to generate a second trace;
    computing a set of states based on the second trace by the computer, wherein each state is a complete assignment of the set of predicates at one moment in time;
    producing a set of logical consequences from the set of states by the computer; and
    enumerating each logical consequence as an assertion by the computer.

2. The method of claim 1, wherein the predicate represents a relation that is Boolean.

3. The method of claim 1, wherein the predicate represents a relation that is multi-valued.

4. The method of claim 1, wherein the set of states is represented as a logical formula in disjunctive normal form.

5. The method of claim 4, wherein the logical formula is reduced using logic optimization techniques.

6. The method of claim 1, wherein the specification of assertions is described in a hardware description language.

7. The method of claim 1, wherein the specification of assertions is described in SystemVerilog Assertions (SVA).

8. The method of claim 1, wherein the specification of assertions is described in Property Specification Language (PSL).

9. The method of claim 1, wherein the specification of assertions is described in Open Verilog Library (OVL).

10. The method of claim 1, wherein the hardware design is described in Verilog.

11. The method of claim 1, wherein the hardware design is described in VHDL.

12. The method of claim 1, wherein the hardware design is expressed in SystemVerilog.

13. A computer readable storage medium having embodied thereon a program, the program being executable by a processor to perform a method for generating assertions of a hardware design, the method comprising:
    accessing trace data of a hardware design, wherein the trace data is a sequence of recorded netlist node values of the hardware design, obtained while the hardware esign executed one or more tests;
    accessing a predetermined set of predicates of the hardware design by a computer, wherein each predicate represents a Boolean relation among netlist nodes in the hardware design;
    projecting the trace data over the set of predicates by a computer to generate a second trace;
    computing a set of states based on the second trace by the computer, wherein each state is a complete assignment of the set of predicates at one moment in time;
    producing a set of logical consequences from the set of states by the computer; and
    enumerating each logical consequence as ar assertion by the computer.

14. The computer readable storage medium of claim 13, wherein the predicate represents a relation that is Boolean.

15. The computer readable storage medium of claim 13, wherein the predicate represents a relation that is multi-valued.

16. The computer readable storage medium of claim 13, wherein the set of states is represented as a logical formula in disjunctive normal form.

17. The computer readable storage medium of claim 16, wherein the logical formula is reduced using logic optimization techniques.

18. The computer readable storage medium of claim 13, wherein the specification of assertions is described in a hardware description language.

19. The computer readable storage medium of claim 13, wherein the specification of assertions is described in SystemVerilog Assertions (SVA).

20. The computer readable storage medium of claim 13, wherein the specification of assertions is described in Property Specification Language (PSL).

21. The computer readable storage medium of claim 13, wherein the specification of assertions is described in Open Verilog Library (OVL).

22. The computer readable storage medium of claim 13, wherein the hardware design is described in Verilog.

23. The computer readable storage medium of claim 13, wherein the hardware design is described in VHDL.

24. The computer readable storage medium of claim 13, wherein the hardware design is described in SystemVerilog.

25. An apparatus for generating assertions of a hardware design, the apparatus comprising:
a processor;
memory;
a first set of instructions stored in memory and executed by the processor to project trace data of a hardware design over a predetermined set of predicates of the hardware design, the trace data is a sequence of recorded netlist node values of the hardware design, obtained while the hardware design executed one or more tests, each predicate representing a Boolean relation among netlist nodes in the hardware design;
a second set of instructions stored in memory and executed by the processor to compute a set of states based on the second trace, wherein each state is a complete assignment of the set of predicates at one moment in time;
a third set of instructions stored in memory and executed by the processor to produce a set of logical consequences from the set of states by the computer; and
a fourth set of instructions stored in memory and executed by the processor to enumerate each logical consequence as an assertion by the computer.

26. The apparatus of claim 25, wherein the predicate represents a relation that is Boolean.

27. The apparatus of claim 25, wherein the predicate represents a relation that is multi-valued.

28. The apparatus of claim 25, wherein the set of states is represented as a logical formula in disjunctive normal form.

29. The apparatus of claim 25, wherein the logical formula is reduced using logic optimization techniques.

30. The apparatus of claim 25, wherein the specification of assertions is described in a hardware description language.

* * * * *